(12) United States Patent
Huang et al.

(10) Patent No.: US 10,756,086 B1
(45) Date of Patent: Aug. 25, 2020

(54) METHOD FOR MANUFACTURING SEMICONDUCTOR AND STRUCTURE AND OPERATION OF THE SAME

(71) Applicant: TAIWAN SEMICONDUCTOR MANUFACTURING COMPANY LTD., Hsinchu (TW)

(72) Inventors: Fu-Chun Huang, Hsinchu County (TW); Ching-Hui Lin, Taichung (TW); Chun-Ren Cheng, Hsinchu (TW); Shih-Fen Huang, Hsinchu County (TW); Alexander Kalnitsky, San Francisco, CA (US)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 16/281,950

(22) Filed: Feb. 21, 2019

(51) Int. Cl.
*H01L 27/07* (2006.01)
*H01L 29/06* (2006.01)
*H01L 49/02* (2006.01)
*H01L 21/8234* (2006.01)
*H01L 21/762* (2006.01)

(52) U.S. Cl.
CPC ........ *H01L 27/0738* (2013.01); *H01L 21/762* (2013.01); *H01L 21/823412* (2013.01); *H01L 21/823475* (2013.01); *H01L 21/823481* (2013.01); *H01L 28/24* (2013.01); *H01L 29/0649* (2013.01)

(58) Field of Classification Search
None
See application file for complete search history.

(56) References Cited

U.S. PATENT DOCUMENTS

2014/0091311 A1* 4/2014 Jeon ............ H01L 29/205
257/76

* cited by examiner

*Primary Examiner* — Jack S Chen
(74) *Attorney, Agent, or Firm* — WPAT, P.C., Intellectual Property Attorneys; Anthony King

(57) ABSTRACT

A method of manufacturing a semiconductor structure is provided, wherein the method includes the following operations. A substrate having a transistor is received, wherein the transistor includes a channel region and a gate on a first side of the channel region. The second side of the channel region of the transistor is exposed, wherein the second side is opposite to the first side. A metal oxide is formed on the second side of the channel region of the transistor, wherein the metal oxide contacts the channel region and is exposed to the environment. A semiconductor structure and an operation of a semiconductor structure thereof are also provided.

14 Claims, 14 Drawing Sheets

US 10,756,086 B1

METHOD FOR MANUFACTURING SEMICONDUCTOR AND STRUCTURE AND OPERATION OF THE SAME

BACKGROUND

The semiconductor integrated circuit (IC) industry has experienced rapid growth. Technological advances in design and IC materials have created IC generations with complex circuits smaller and more complex than each previous generation. Integration of an IC structure with other electrical components in order to perform a specific function is also challenged due to the trend toward complex and reduced-scale IC structures. The integration of the IC structure and an electrical component is required to not just enhance performance of the device but also provide good compatibility of the IC structure and the electrical component.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
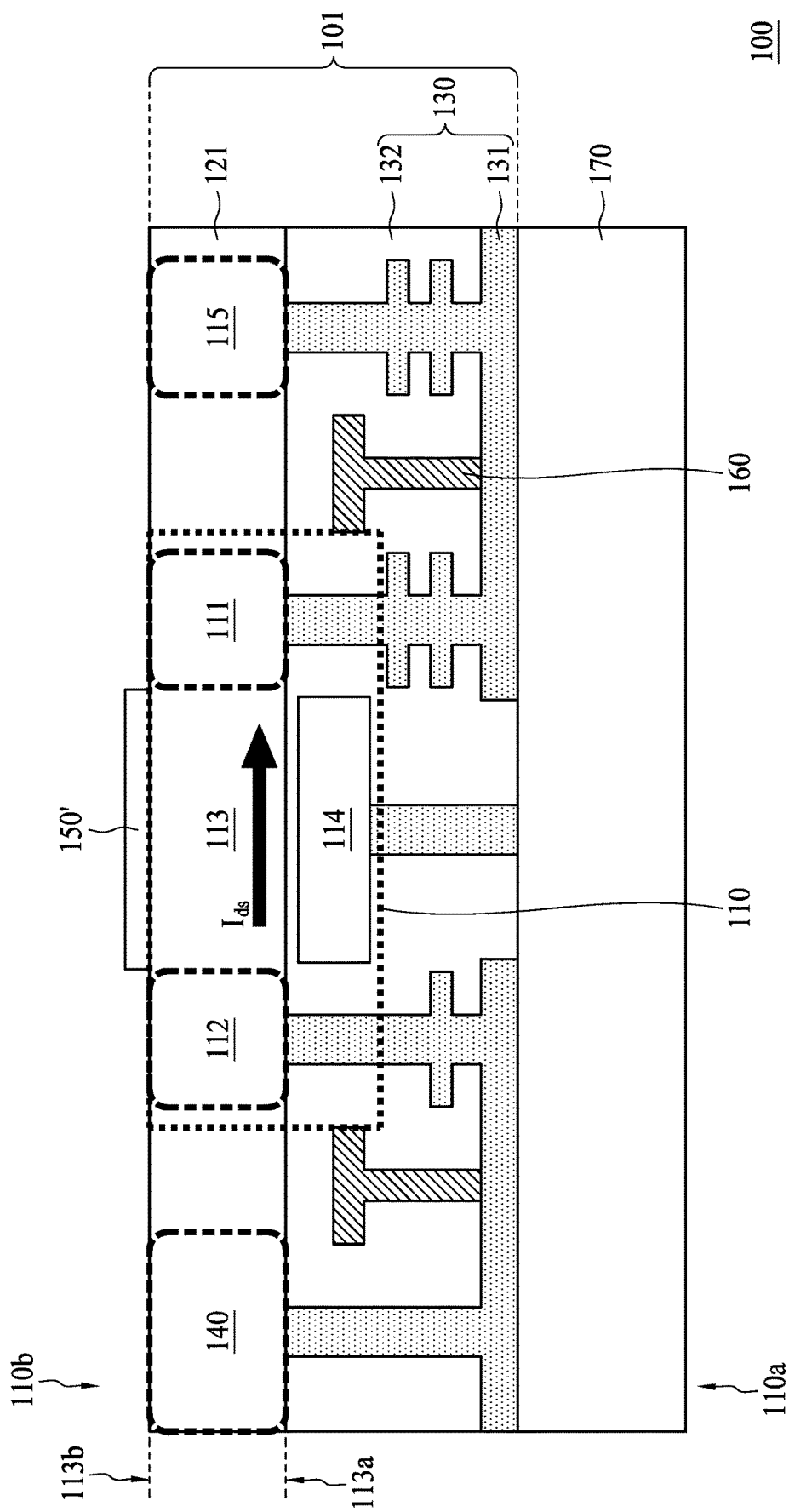
FIG. 1 is a cross-sectional diagram of a semiconductor structure in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

In order to illustrate concepts of the present disclosure, various embodiments are provided below. However, it is not intended to limit the present disclosure to specific embodiments. In addition, elements, conditions or parameters illustrated in different embodiments can be combined or modified to have different combinations of embodiments as long as the elements, parameters or conditions used are not conflicted. For ease of illustration, reference numerals with similar or same functions and properties are repeatedly used in different embodiments and figures, but this is not intended to limit the present disclosure to specific embodiments.

Figure 2:
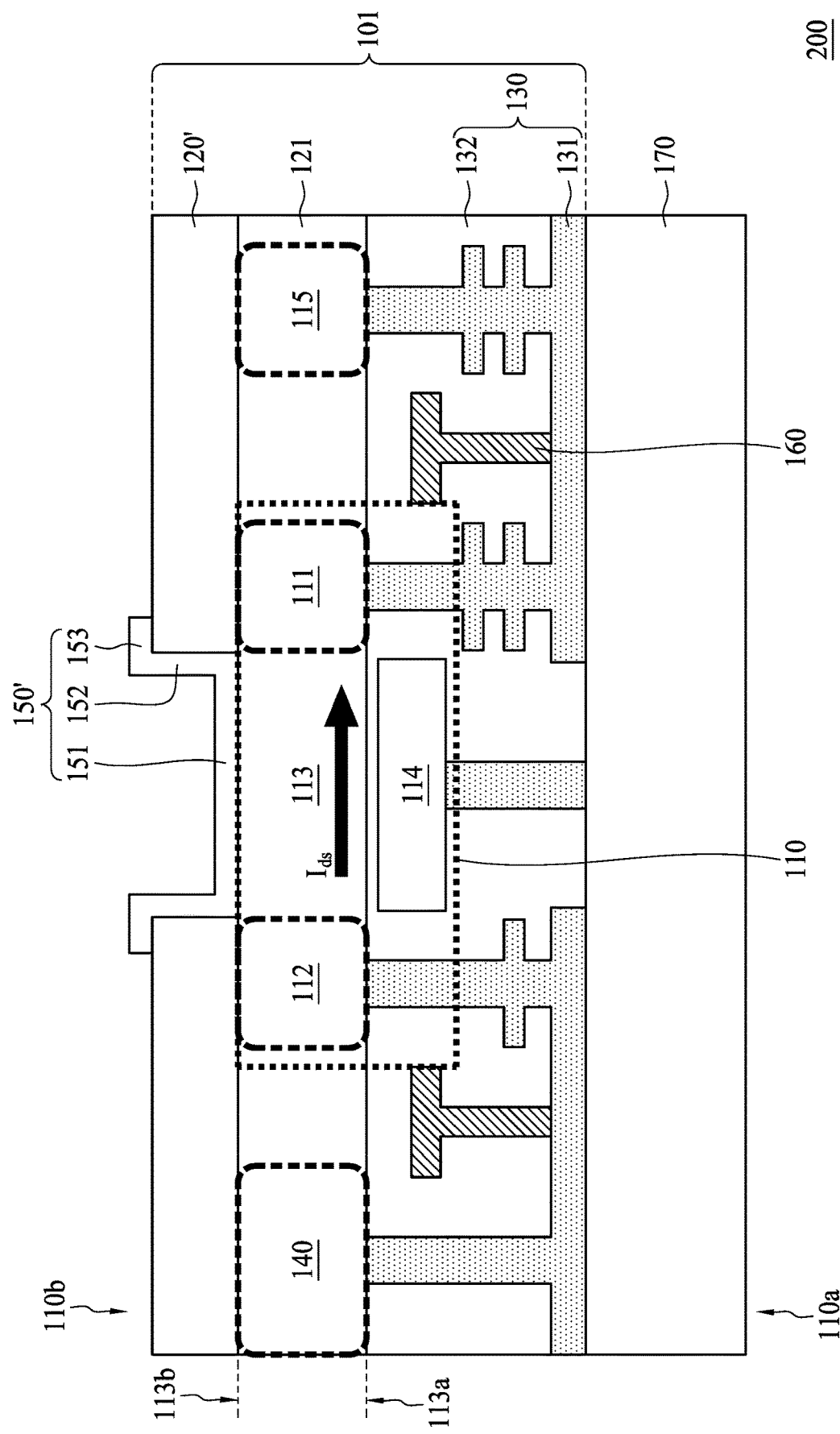
FIG. 2 is a cross-sectional diagram of a semiconductor structure in accordance with some embodiments of the present disclosure.
Figure 3:
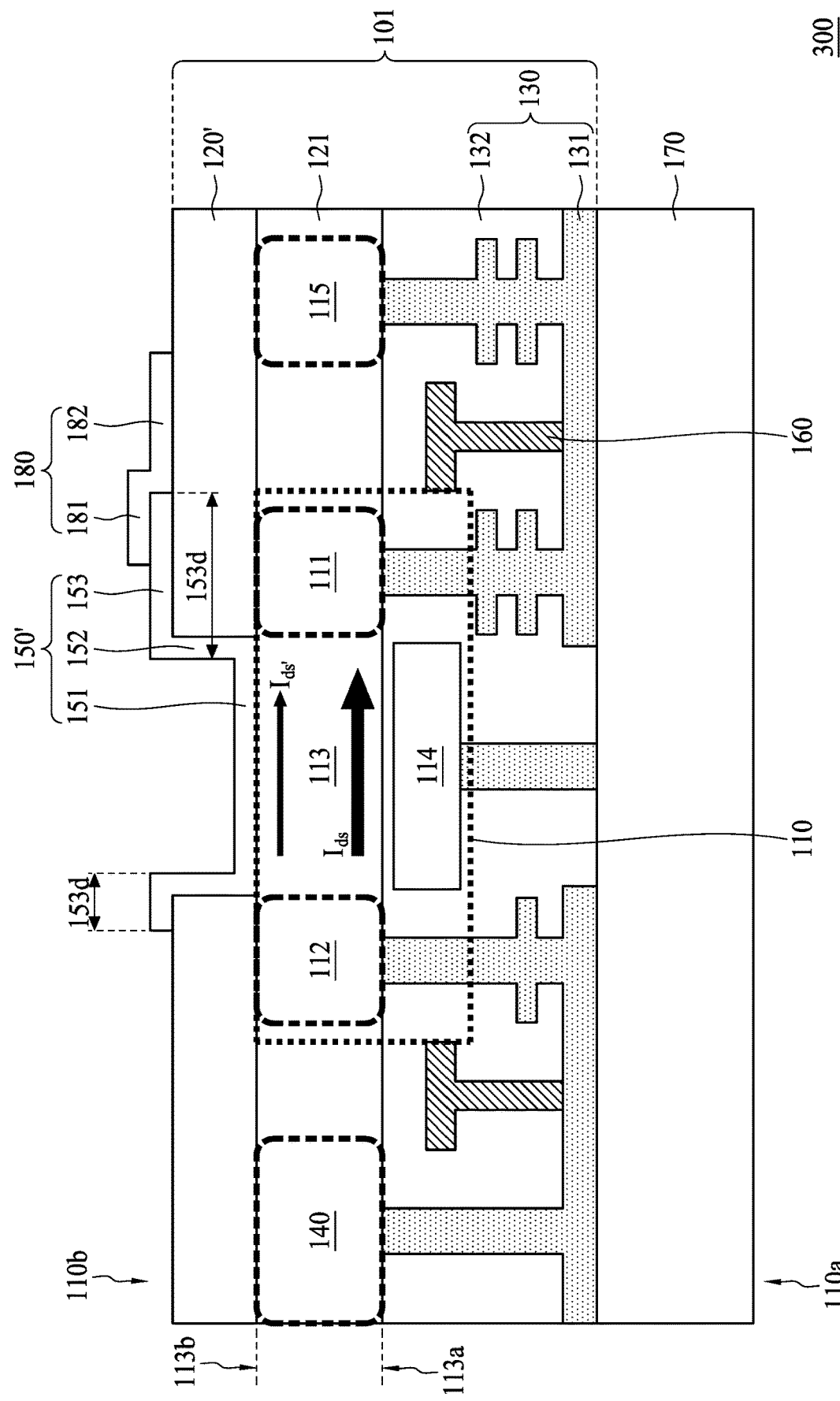
FIG. 3 is a cross-sectional diagram of a semiconductor structure in accordance with some embodiments of the present disclosure.

From an aspect of the present disclosure, a semiconductor structure is provided in accordance with some embodiments. FIGS. 1 to 3 shows semiconductor structures 100, 200 and 300 respectively in accordance with different embodiments of the present disclosure. Referring to FIG. 1, the semiconductor structure 100 includes a transistor 110, an interconnect structure 130 on a first side 110a of the transistor 110, and a metal oxide 150' on a second side 110b of the transistor 110, wherein the first side 110a is opposite to the second side 110b. The transistor 110 includes a source 111, a drain 112, a channel region 113 and a gate 114. The channel region 113 is formed in a doping region 121 of a semiconductive substrate 101 and between the source 111 and the drain 112. The gate 114 is formed on a first side 113a of the channel region 113 proximal to the first side 110a of the transistor 110. In some embodiments, a gate dielectric (not shown) is disposed between the gate 114 and the channel region 113. In some embodiments, a surface of the source 111 proximal to the second side 110b of the transistor 110 is coplanar with a surface of the doping region 121 proximal to the second side 110b of the transistor 110. In some embodiments, a surface of the drain 112 proximal to the second side 110b of the transistor 110 is coplanar with a surface of the doping region 121 proximal to the second side 110b of the transistor 110.

The metal oxide 150' is formed on a second side 113b of the channel region 113 between the source 111 and the drain 112, wherein the second side 113b is opposite to the first side 113a. The metal oxide 150' is exposed to the environment to detect concentration of a target gas. The metal oxide 150' reacts with the target gas, and oxidation and/or reduction reactions occur when the metal oxide 150' is in contact with the target gas. In some embodiments, the metal oxide 150' includes at least one of zinc oxide (ZnO), tin oxide (SnO), oxoindium (InO), zirconium oxide (ZrO), cerium oxide (CeO), and nickel oxide (NiO). In some embodiments, the metal oxide 150' contacts the second side of the channel region 113. In some embodiments, the metal oxide 150' contacts an edge of the source 111 and/or the drain 112.

The metal oxide 150' is exposed to react with the target gas in the environment to change an electrical resistance of the transistor. The metal oxide 150' functions like a resistor. A first voltage on the gate 114 generates a current $I_{ds}$, and a corresponding conductivity (or resistance) of the channel region 113 of the transistor 114 can be determined. An amount of change to the electrical charge on the metal oxide 150' changes the conductivity of the channel region 113. This change in conductivity indicates an amount of change in a concentration of the target gas. In some embodiments, the target gas includes at least one of carbon monoxide (CO), carbon dioxide ($CO_2$), hydrogen ($H_2$), hydrogen sulfide ($H_2S$), methane ($CH_4$), ammonia ($NH_4$) and alcohol.

For instance, in some embodiments, the metal oxide 150' is made of zinc oxide (ZnO) and the target gas is carbon monoxide (CO). Oxidation of the metal oxide 150' occurs, and oxygen in the environment attaches to the metal oxide 150' to form oxygen ions ($O^-$) that are adsorbed on the metal oxide 150'. Electrical charges are transferred from the metal oxide 150' to the oxygen, and the conductivity of the metal oxide 150' is low due to low concentration of electrons in the metal oxide 150'. As the CO gas in the environment increases, oxygen ions ($O^-$) adsorbed on the metal oxide 150' react with the CO gas to form carbon dioxide ($CO_2$), and electrons are released back to the metal oxide 150' (reduction reaction of the metal oxide 150'). Thus, the conductivity of the metal oxide 150' is increased, and the resistance of the transistor 110 is increased.

In some embodiments, the first voltage is provided continuously. In some embodiments, the first voltage is provided periodically with each elapsing of a default time interval. The current $I_{ds}$ is generated by providing the first voltage to the gate 114, and the current $I_{ds}$ is measured after each default time interval elapses. The resistance of the transistor 110 and the current $I_{ds}$ are stable (or within a predetermined range) when a concentration of the CO gas is stable (or within a safe range). When a concentration of the CO in the environment changes, the resistance of the transistor 110 is changed. The resistance of the transistor 110 depends on the change of the electrical conductivity (or the electrical resistance) of the metal oxide 150'. The current $I_{ds}$ generated by the first voltage is correspondingly increased or decreased. It is determined whether the current $I_{ds}$ generated in the transistor 110 by the first voltage exceeds the predetermined range or not. In some embodiments, a concentration of the target gas is determined according to the current $I_{ds}$. In some embodiments, the transistor 110 or the semiconductor structure 100, 200 or 300 electrically connects to an alarm, and the alarm is activated if the current $I_{ds}$ exceeds the predetermined range or the target gas is determined to exceed a safe range.

In some embodiments, the interconnect structure 130 includes a dielectric layer 132 and metal interconnects 131. In some embodiments, the interconnect structure 130 includes multiple layers of the metal interconnects 131 respectively within multiple dielectric layers 132. The interconnect structure 130 makes electrical connection with various doping regions and other devices formed within the semiconductive substrate 101. The metal interconnects 131 may be manufactured using fabrication processes well known to a person skilled in the relevant art. It should be noted that, for purposes of brevity and clarity, only one dielectric layer 132 and one layer of the metal interconnects 131 are illustrated in the figures, but it is not intended to limit the present disclosure. The dielectric layer 132 is formed on the doping region 121 proximal to the first side 113a of the channel region 113 and the first side 110a of the transistor 110. The metal interconnects 131 are formed in the dielectric layer 132 and electrically connect the source 111, the drain 112 and the gate 114, respectively. In some embodiments, the interconnect structure 130 electrically connects the transistor 110 to an external device 170. In some embodiments, the external device 170 may include a temperature control loop, a temperature sensor, a signal detector, an alarm, or other electrical devices.

In some embodiments, the transistor 110 is coupled to a circuit 140 fabricated within the semiconductive substrate 100. In some embodiments, the circuit 140 can be a group of circuits. In some embodiments, the circuit 140 electrically connects to the transistor 110 through the metal interconnects 131. In some embodiments, the circuit 140 is electrically coupled to the drain 112 of the transistor 110 through the metal interconnects 131. The circuit 140 may include any number of MOSFET devices, resistors, capacitors or inductors to form circuitry to aid in the operation of the sensor 101. The circuit 140 may include amplifiers, analog to digital converters (ADCs), digital to analog converters (DACs), voltage generators, logic circuitry and DRAM memory. In some embodiments, all or some of the components of the circuit 140 may be integrated in the same semiconductive substrate 101 as the transistor 100 or on the same substrate as the semiconductor structure 100. It should be understood that many sensors, each substantially similar to the sensor 101, may be integrated on the substrate 101 and coupled to the circuit 140. In some embodiments, all or some of the components of circuit 140 are provided on another substrate separate from semiconductive substrate 101. In yet other embodiments, some components of the circuit 140 are integrated in the same semiconductive substrate 101 as the sensor 101, and some components of the circuit 140 are provided on another substrate separate from the semiconductive substrate 101. In some embodiments, the gate 114 is configured to be charged and discharged by the circuit 140, which is coupled to the gate 114.

In some embodiments, the semiconductor structure 100 further includes at least a heater 160. The heater 160 functions to facilitate oxidation and/or reduction reactions of the metal oxide 150' and thus to facilitate gas sensing and sensitivity of the semiconductor structure 100. The heater 160 is arranged proximal to the metal oxide 150' to change a temperature of the environment surrounding the metal oxide 160. In some embodiments, the heater 160 is formed in the semiconductive substrate 101. In some embodiments, the heater 160 is formed in the dielectric layer 132 of the interconnect layer 130. In some embodiments, the heater 160 is formed between the metal interconnects 131. In some embodiments, the heater 160 functions to provide thermal energy after every interval of a default time period to facilitate reduction reactions of the metal oxide 150' in order to restore the electrical charges. It is determined whether the current generated in the transistor 110 exceeds a predetermined range, and thus it is detected when a concentration of the target gas is outside of a desired range or a safe range.

In some embodiments, the semiconductor structure 100 further includes a body region 115, separated from the source 111 and drain 112. The body region 115 may be used to bias the carrier concentration in the doping region 121 between the source 111 and the drain 112. As such, a negative voltage bias may be applied to the body region 115 to improve the sensitivity of the semiconductor structure 100. In some embodiments, the body region 115 is electrically connected to the source 111. In some embodiments, the body region 115 is electrically grounded.

FIG. 2 illustrates the semiconductor structure 200 in accordance with some embodiments of the present disclosure. In addition to the features included in the semiconductor structure 100, the semiconductor structure 200 further includes an isolation 120' (e.g. an oxide layer, a nitride layer, an oxynitride layer or a layer comprising another suitable material). The isolation 120' is disposed over the second side 113b of the channel region 113 and proximal to the second side 110b of the transistor 110. The second side 113b of the channel region 113 is exposed through the isolation 120' from a top view perspective. The metal oxide 150' is conformal to a portion of the isolation 120' adjacent to the channel region 113 and an exposed portion of the channel region 113. A reacting area of the metal oxide 150' of the semiconductor structure 200 larger than that of the semiconductor structure 100 is provided to have better sensitivity.

In some embodiments, the metal oxide 150' includes a horizontal portion 151 physically contacting second side 113b of the channel region 113, a vertical portion 152 connecting the horizontal portion 151 and lining on the isolation 120', and optionally an extension portion 153 connecting the vertical portion 152 and substantially parallel to the horizontal portion 151. In some embodiments, the vertical portion 152 is substantially vertical to the horizontal portion 151. In some embodiments, the extension portion 153 covers on a surface of the isolation 120' proximal to the second side 110b of the transistor 110. In some embodiments, the metal oxide 150' includes only the horizontal portion 151 and the vertical portion 152. In some embodiments, the vertical portion 152 covers only a portion of the sidewall of the isolation 120' adjacent to the channel region 113.

FIG. 3 illustrates the semiconductor structure 300 in accordance with some embodiments of the present disclosure. In addition to the features included in the semiconductor structure 200, the semiconductor structure 300 further includes an electrical contact 180 on the second side of the transistor 110. The electrical contact 180 serves to provide an electrical path for providing a voltage bias to the metal oxide 150' to generate a (secondary) current $I_{ds'}$ in the channel region 113. The metal oxide 150' functions like a gate (or a gate electrode) of the transistor 110 (for ease of illustration, the gate 114 is referred to as the first gate, and the metal oxide 150' in some embodiments is referred to as the second gate), and the semiconductor structure 300 includes the dual-gate transistor 110. The first gate 114 and the second gate 150' are connected to different electrical nodes. Each one of the first gate 114 and the second gate 150' may be electrically charged and/or discharged and each thereby influences the electric field between the source 111 and the drain 112 of the dual-gate transistor 110. In some embodiments, the metal oxide 150' functions like an amplifier to amplify the signal of the current $I_{ds}$, which is generated by a first voltage provided to the first gate 114, by providing a second voltage to the second gate 150'. The second voltage generates the current $I_{ds'}$, and a total amount of the current (the current $I_{ds}$ and the current $I_{ds'}$) generated in the channel region 113 is increased. Thus, a change of the current generated in the channel 113 due to the change of the conductivity of the metal oxide 150' is easier to be detected.

In some embodiments, at least a portion of the extension portion 153 of the metal oxide 150' of the semiconductor structure 300 is larger than that of the semiconductor structure 200 from a top view (not shown). The extension portion 153 extension provides a larger process window to formation of the electrical contact 180. In some embodiments, the electrical contact 180 formed conformal on the metal oxide 150' and the isolation 120'. In some embodiments, the extension portion 153 has an extension length 153d, which is measured from an edge of the extension portion 153 connecting the vertical portion 152 to an opposite edge the extension portion 153 disposed on the isolation 120' and away from the edge from a cross sectional. In some embodiments, the extension length 153d varies as shown in FIG. 3. In other embodiments, the extension length 153d is constant, like the metal oxide 150' shown in FIG. 2.

In some embodiments, the electrical contact 180 contacts a portion of the extension portion 153 of the metal oxide 150' and an exposed portion of the isolation 120' adjacent to the extension portion 153. In some embodiments, electrical contact 180 contacts the extension portion 153 having a larger extension length 153d. In some embodiments, the electrical contact 180 includes a first portion 181 contacting the extension portion 153 of the metal oxide 150', and a second portion 182 contacting the exposed portion of the isolation 120'. In some embodiments, the second portion 182 of the electrical contact 180 connects to an electrical connection structure for provide the second voltage. The configuration of the electrical contact 180 provides a larger process window in the process of probe the electrical contact 180 or in formation of the electrical connection structure connecting the electrical contact 180.

Figure 4:
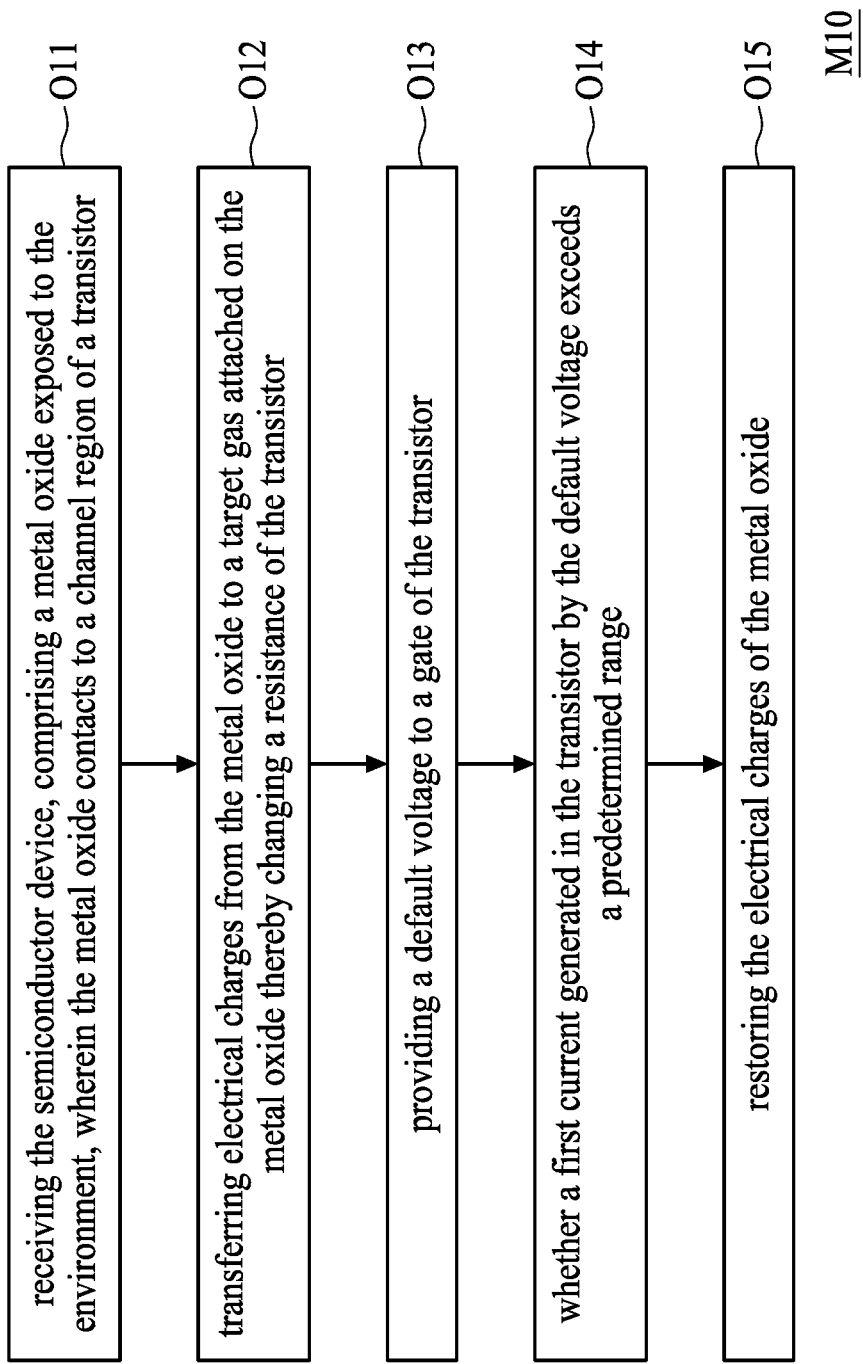
FIG. 4 is a flowchart of an operation of a semiconductor structure in accordance with some embodiments of the present disclosure.

Therefore, according to another aspect of the present disclosure, an operation of a semiconductor device is provided. FIG. 4 shows a flowchart of an operation M10 of a semiconductor device in accordance with some embodiments of the present disclosure. The operation M20 includes: (O11) receiving the semiconductor device, comprising a metal oxide exposed to the environment, wherein the metal oxide contacts a channel region of a transistor; (O12) transferring electrical charges from the metal oxide to a target gas attached to the metal oxide, thereby changing a resistance of the transistor; (O13) providing a default voltage to a gate of the transistor ; (O14) determining whether a first current generated in the transistor by the default voltage exceeds a predetermined range; and (O15) restoring the electrical charges of the metal oxide.

Figure 5:
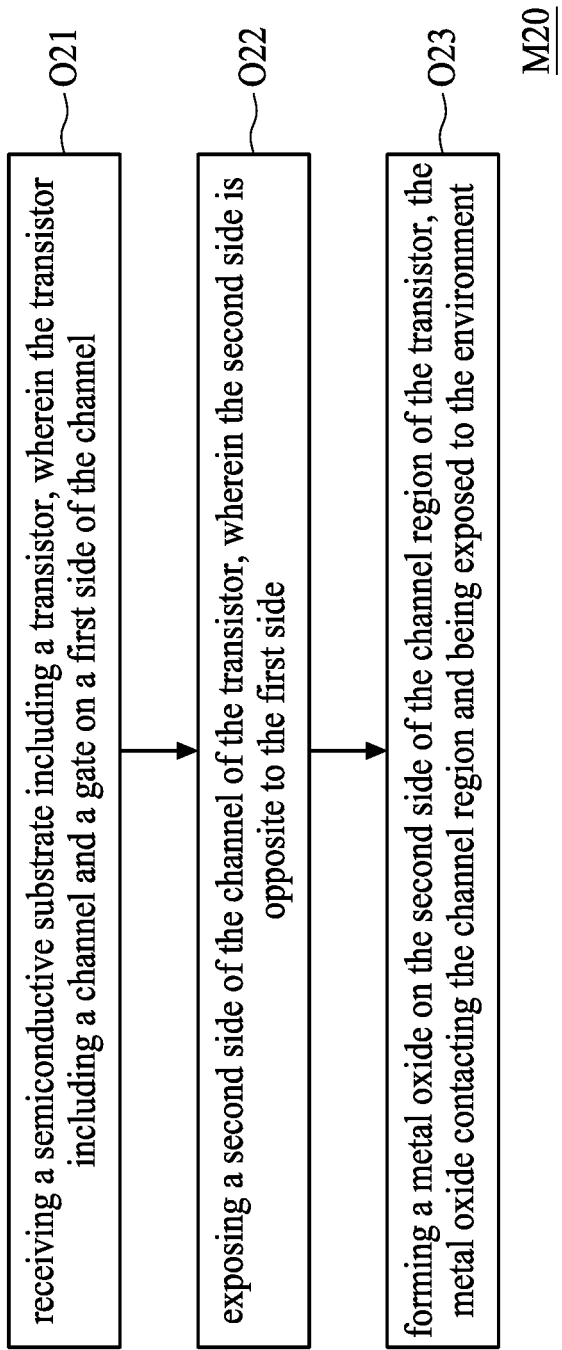
FIG. 5 is a flowchart of a method for manufacturing a semiconductor structure in accordance with some embodiments of the present disclosure.

In order to provide a semiconductor structure similar to those shown in FIG. 1, 2 or 3, according to another aspect of the present disclosure, a method M20 for manufacturing a semiconductor structure is provided. FIG. 5 shows a flowchart of the method M20 for manufacturing a semiconductor structure, or a gas sensor in particular, in accordance with some embodiments of the present disclosure. The method M20 includes: (O21) receiving a semiconductive substrate including a transistor, wherein the transistor includes a channel region and a gate on a first side of the channel region; (O22) exposing a second side of the channel region of the transistor, wherein the second side is opposite to the first side; and (O23) forming a metal oxide on the second side of the channel region of the transistor, the metal oxide contacting the channel region and being exposed to the environment.

Figure 6:
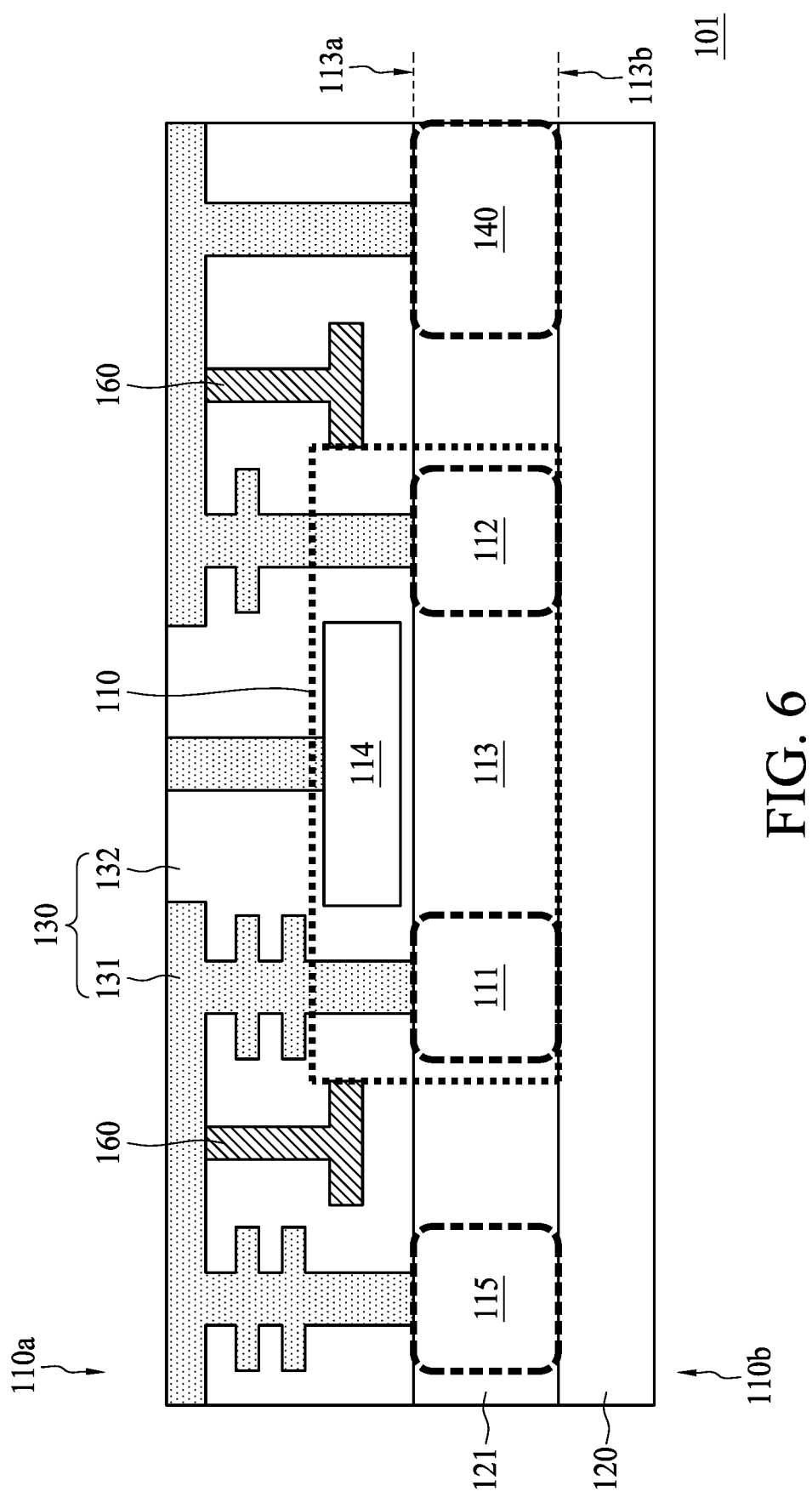
FIGS. 6 to 10 are cross-sectional diagrams of a semiconductor structure in one of numerous operations respectively in accordance with some embodiments of the present disclosure.

Referring to FIG. 6, a semiconductive substrate 101 is provided or received. The semiconductive substrate 101 includes a buried oxide (BOX) layer 120, a doping region 121, an interconnect structure 130 and a transistor 110. The BOX layer 120, the doping region 121 and the interconnect layer 130 are stacked in sequence. In some embodiments, the semiconductive substrate 101 includes monocrystalline silicon and/or polysilicon. In some embodiments, the BOX layer 120 is formed in the semiconductive substrate 101 by oxygen precipitation, oxygen implantation, or other suitable techniques. The transistor 110 includes a source 111, a drain 112, a channel region 113 and a gate 114. The source 111, the drain 112 and the channel region 113 are formed in the doping region 121 of the semiconductive substrate 101. In some embodiments, the channel region 113 is a portion of the doping region between the source 111 and the drain 112. In some embodiments, the source 111 and the drain 112 are formed by doping operations with different dopants having different types of conductivity. In some embodiments, a circuit 140 is formed concurrently with the transistor 110 in the semiconductive substrate 101.

In some embodiments, the gate 114 formed after formation of the source 111 and the drain 112. The gate 114 is formed on a first side 113a of the channel region 113. In some embodiments, the interconnect structure 130 is on the first side 113a of the channel region, and includes a dielectric layer 132 and one or more metal interconnects 131 formed in the dielectric layer 132 to electrically connect the source 111, the drain 112 and the gate 114, respectively. In some embodiments, a deposition of the dielectric layer 132 is formed over the doping region 121 and the first side 113a of the channel region 113, and adjacent to the gate 114. The metal interconnects 131 are then formed in a plurality of vias of the dielectric layer 132 and also on the dielectric layer 132. The interconnect structure 130 may include multiple dielectric layers and multiple metal lines. The metal interconnects 131 electrically connect the source 111, the drain 112 and the gate 114, respectively.

In some embodiments, at least a heater 160 is formed within the interconnect structure 130 during the formation of the interconnect structure 130. The heater 160 may be used to locally increase a temperature around the transistor 110 and a metal oxide 150' to be formed. The heater 160 may be constructed using any known technique, such as forming a metal pattern with a high current running therethrough. The heater 160 may also be a thermoelectric heater/cooler, such as a Peltier device. In some embodiments, the heater 160 is electrically connected to the circuit 140. In some embodiments, a control loop may be created to control the temperature using the heater 160 and the feedback received from a temperature sensor. In some embodiments, the control loop and/or the temperature sensor can be created in the circuit 140 or in an external device 170.

Figure 7:
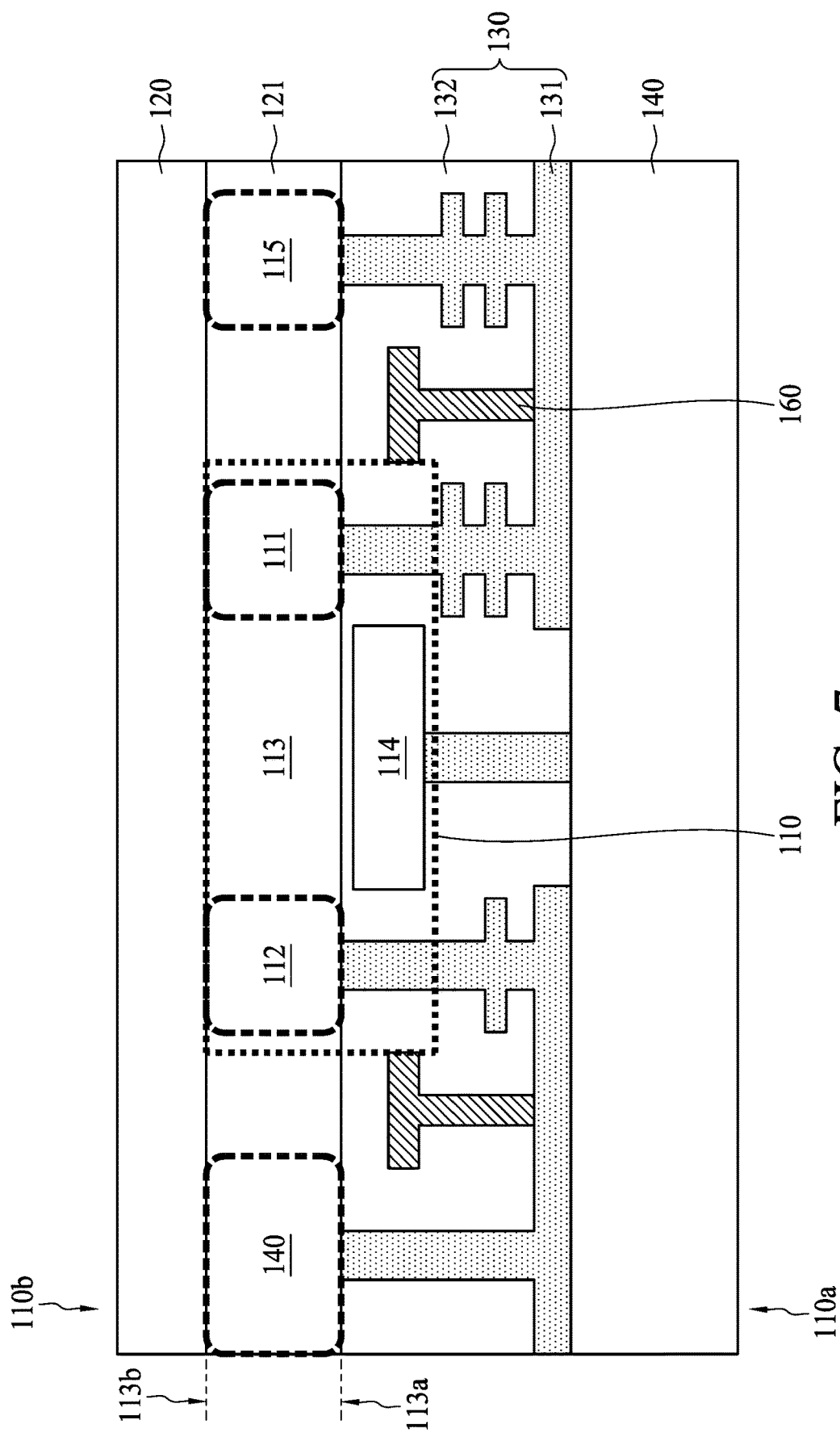

Referring to FIG. 7, the semiconductive substrate 101 is flipped over and attached to a handling substrate 102. Next, at least a portion of the BOX layer 120 is removed to expose a second side 113b of the channel region 113, wherein the second side 113b is opposite to the first side 113a.

Figure 8:
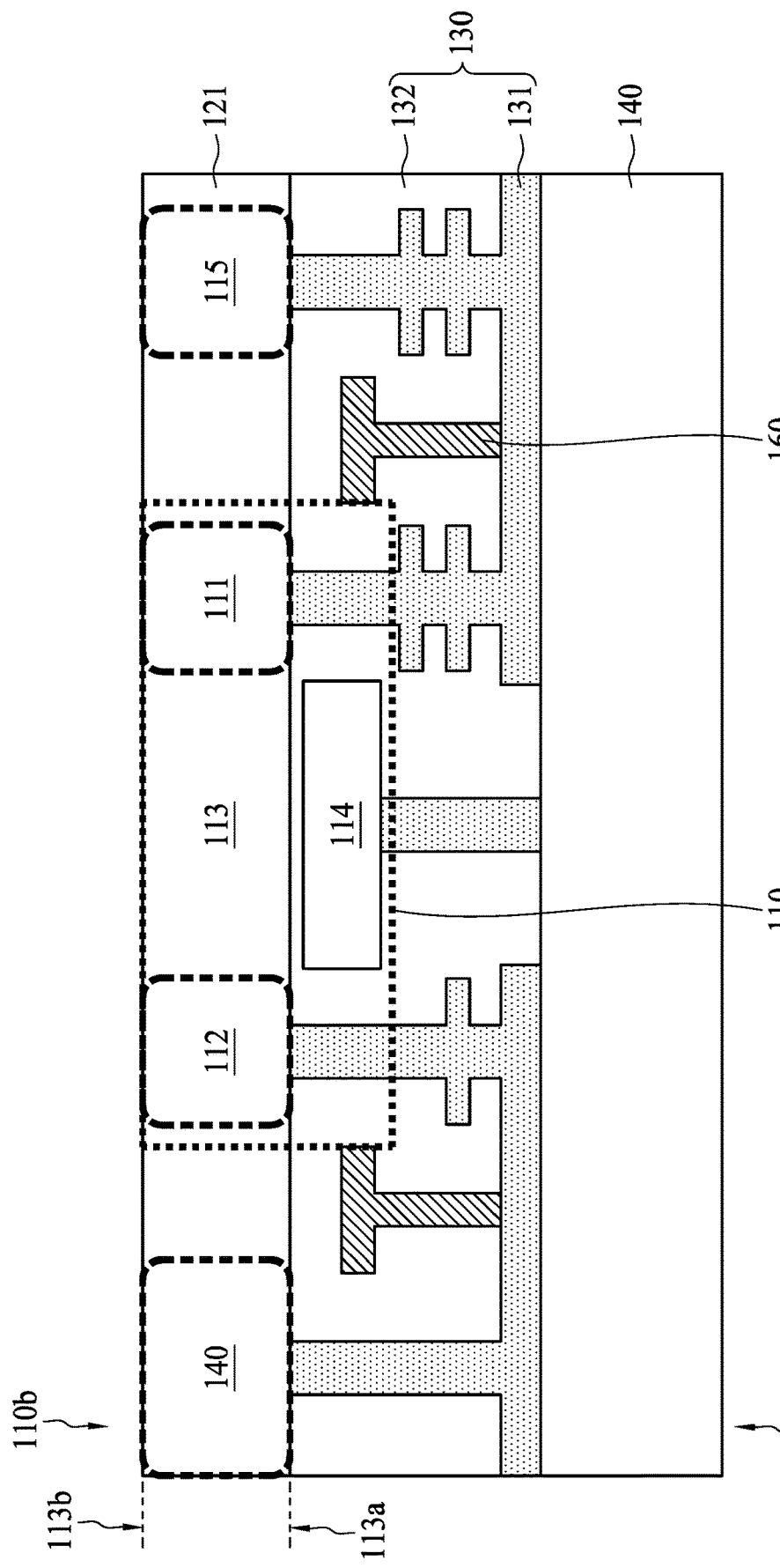
Figure 9:
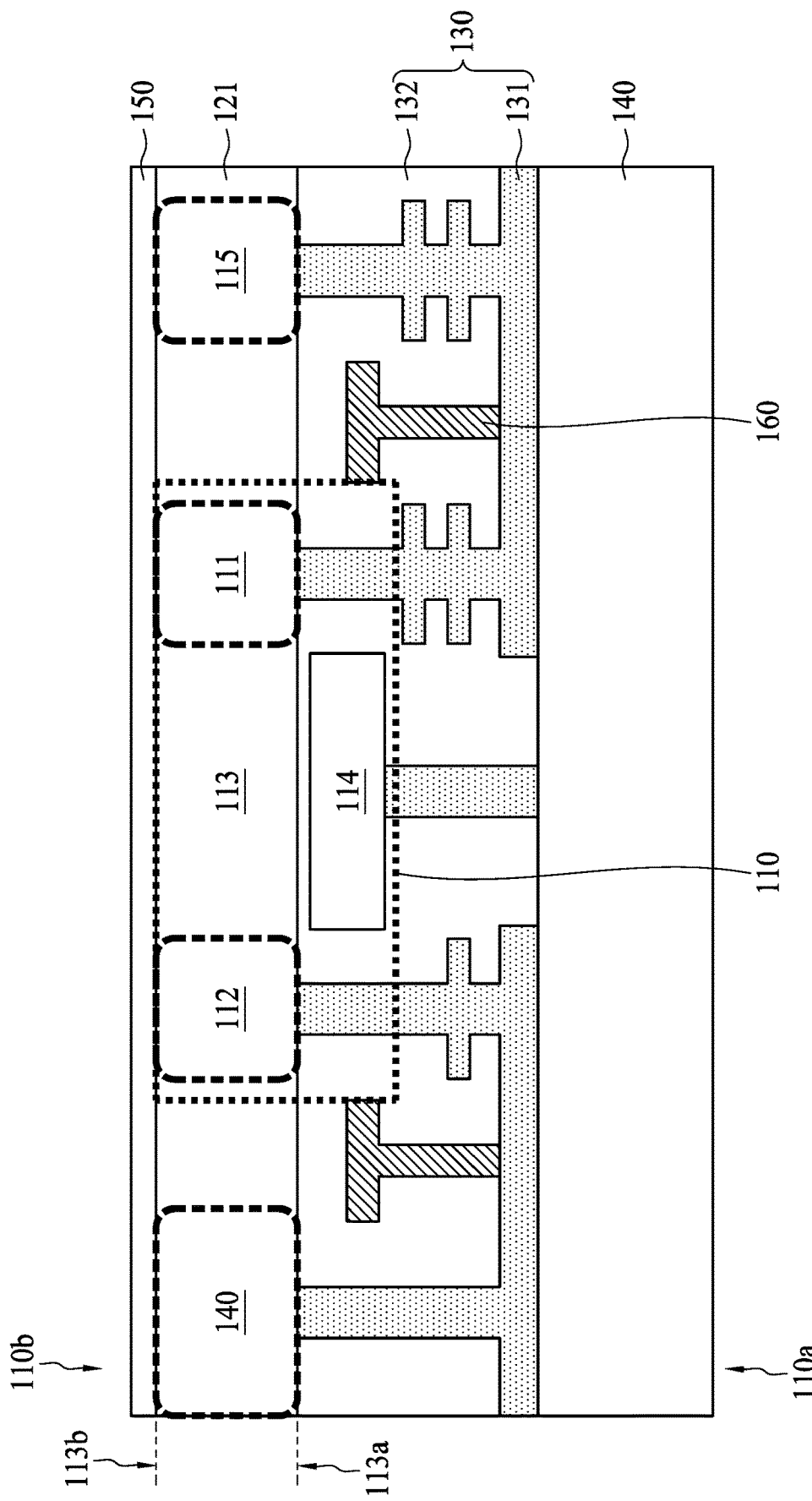

In some embodiments as shown in FIGS. 8 to 9, the entire BOX layer is removed to expose the entire doping region 121, including the second side 113b of the channel region 113. In some embodiments, a portion of the source 111 and/or a portion of the drain 112 proximal to the second side 113b of the channel region 113 are also exposed. Referring to FIG. 9, a linear layer 150 is formed over the second side of the channel region 113 on the exposed doping region 121. In some embodiments, the linear layer 150 is formed by blanket deposition process or conformal deposition process. In some embodiments, the linear layer 150 includes metal oxide. In some embodiments, the linear layer 150 includes at least one of zinc oxide (ZnO), tin oxide (SnO), oxoindium (InO), zirconium oxide (ZrO), cerium oxide (CeO), and nickel oxide (NiO). In some embodiments, the linear layer 150 contacts the second side of the channel region 113.

Figure 10:
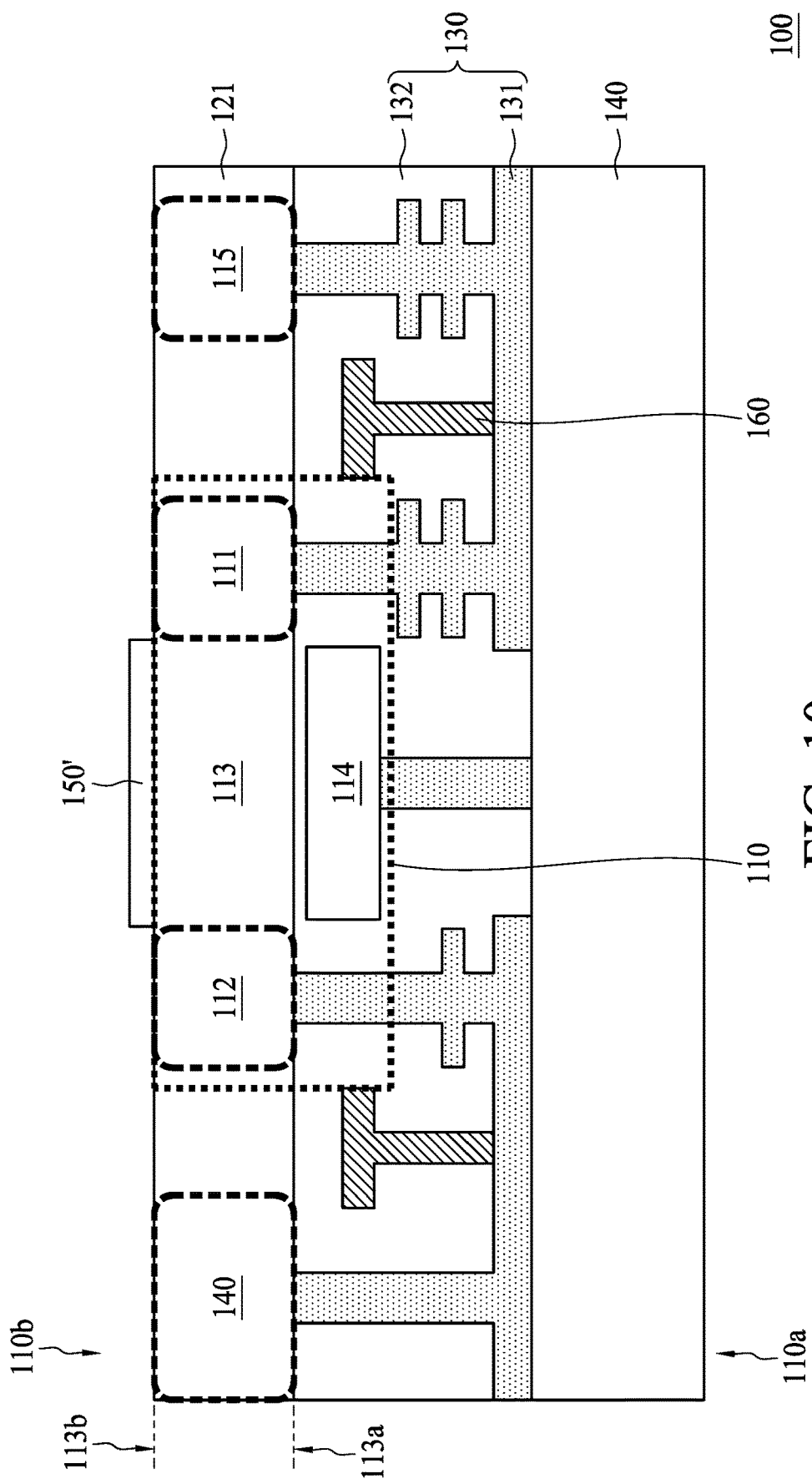

Referring to FIG. 10, the linear layer 150 is patterned to form a linear layer 150' (similar to the aforementioned metal oxide 150' in FIG. 1). A portion of the linear layer 150 is removed by the patterning operation, and the linear layer 150' is disposed between the source 112 and the drain 113 and covers the second side of the channel region 113. In some embodiments, the linear layer 150' covers an edge of one of the source 111 and the drain 112 adjacent to the channel region 113. In some embodiment, the linear layer 150' covers the edges of both of the source 111 and the drain 112 adjacent to the channel region 113. The semiconductor structure 100 is formed.

Figure 11:
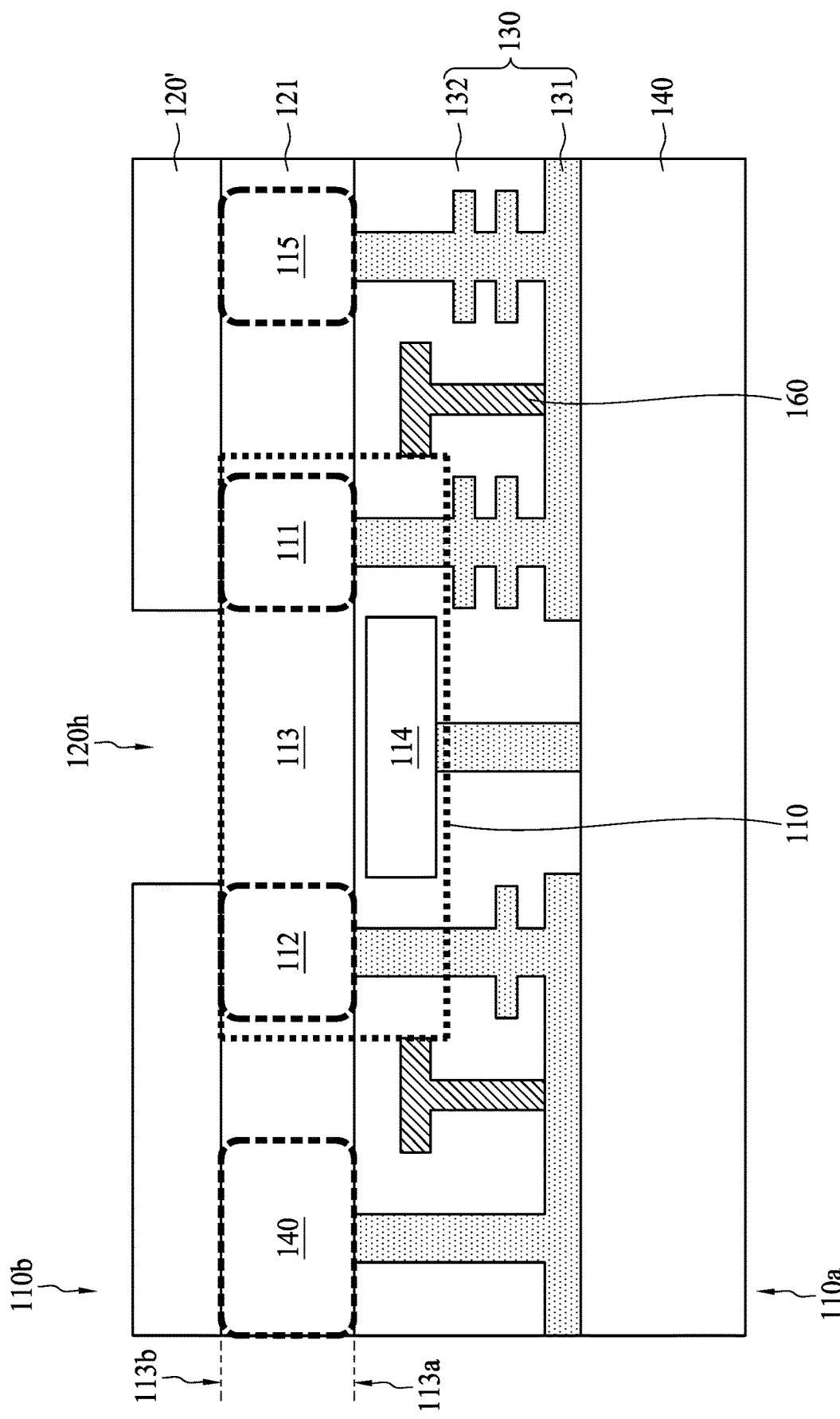
FIGS. 11 to 13 are cross-sectional diagrams of a semiconductor structure in one of numerous operations respectively in accordance with some embodiments of the present disclosure.

In other embodiments, only a portion of the BOX layer 120 is removed to expose the second side 113b of the channel region 113. Referring to FIG. 11, in accordance with some embodiments, the portion of the BOX layer 120 over the second side 113b of the channel region 113 is removed. In other words, the portion of the doping region 121 between the source 111 and the drain 112 is exposed in order to expose the second side 113b of the channel region 113. In some embodiments, the portion of the BOX layer 120 is removed to form a through hole 120h on the BOX layer 120, thereby forming a BOX layer 120'. In some embodiments, the BOX layer 120' is similar to or the same as the isolation 120' in FIG. 2. Thus the formation of the isolation 120' can be integrated with the formation of a conventional buried oxide layer in a semiconductor manufacturing process. In other embodiments without formation of a buried oxide layer in the semiconductor manufacturing process, the isolation 120' can be formed by deposition of a dielectric layer over the second side 110b of the transistor 110 after flipping over the semiconductive substrate 101.

Figure 12:
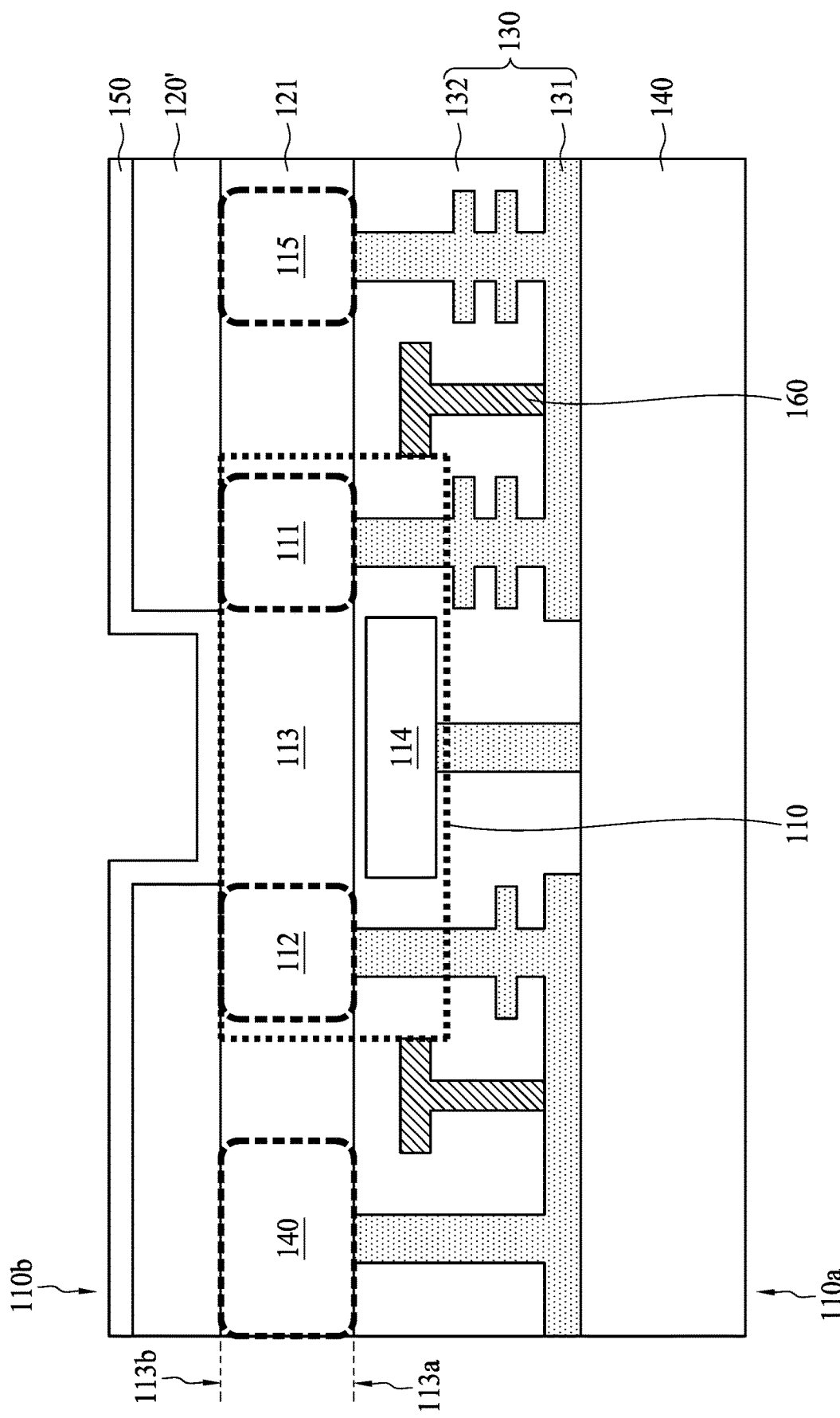

Referring to FIG. 12, a linear layer 150 is formed over the second side 113b of the channel region 113. In some embodiments, the linear layer 150 is formed by a conformal deposition operation over the second side 110b of the transistor 110. In some embodiments, the linear layer 150 is formed lining the through hole 113h and also lining the exposed second side 113b of the channel region 113. In some embodiments, the linear layer 150 contacts both the channel region 113 and the BOX layer 120'.

Figure 13:
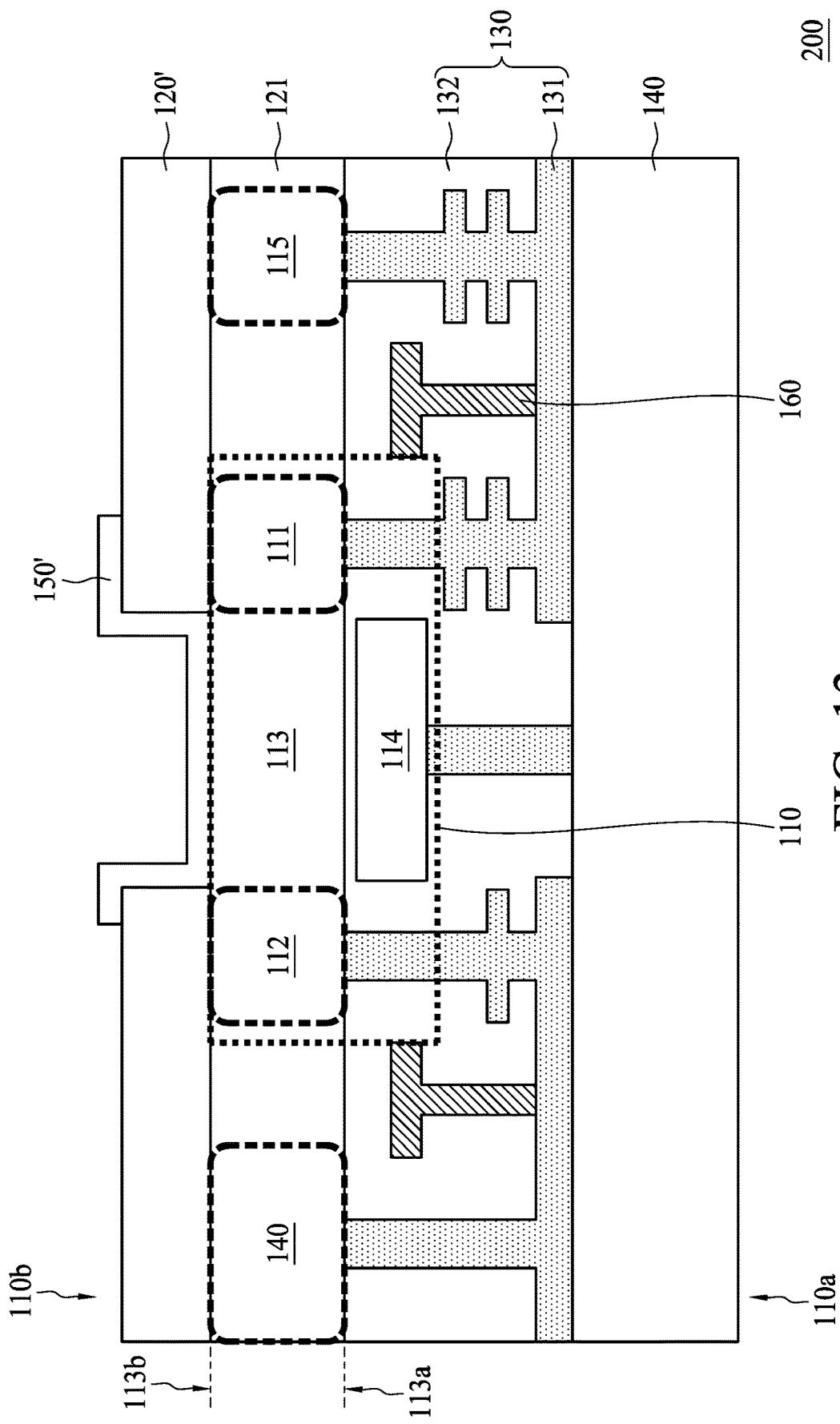

Referring to FIG. 13, a portion of the linear layer 150 is removed to form a linear layer 150' (similar to the aforementioned metal oxide 150' in FIG. 2). The linear layer 150' lines the through hole 120h. In some embodiments, a portion of the linear layer 150' is disposed on an exposed side of the BOX layer 120' opposite to the doping region 121 and proximal to a second side 110b of the transistor 110. In some embodiments, a portion of the BOX layer 120' connecting the through hole 120h is also covered by the linear layer 150'. The linear layer 150' covers a peripheral portion of the source 111 and/or the drain 112 adjacent to the channel region 113 from a top view perspective. The semiconductor structure 200 is formed.

Figure 14:
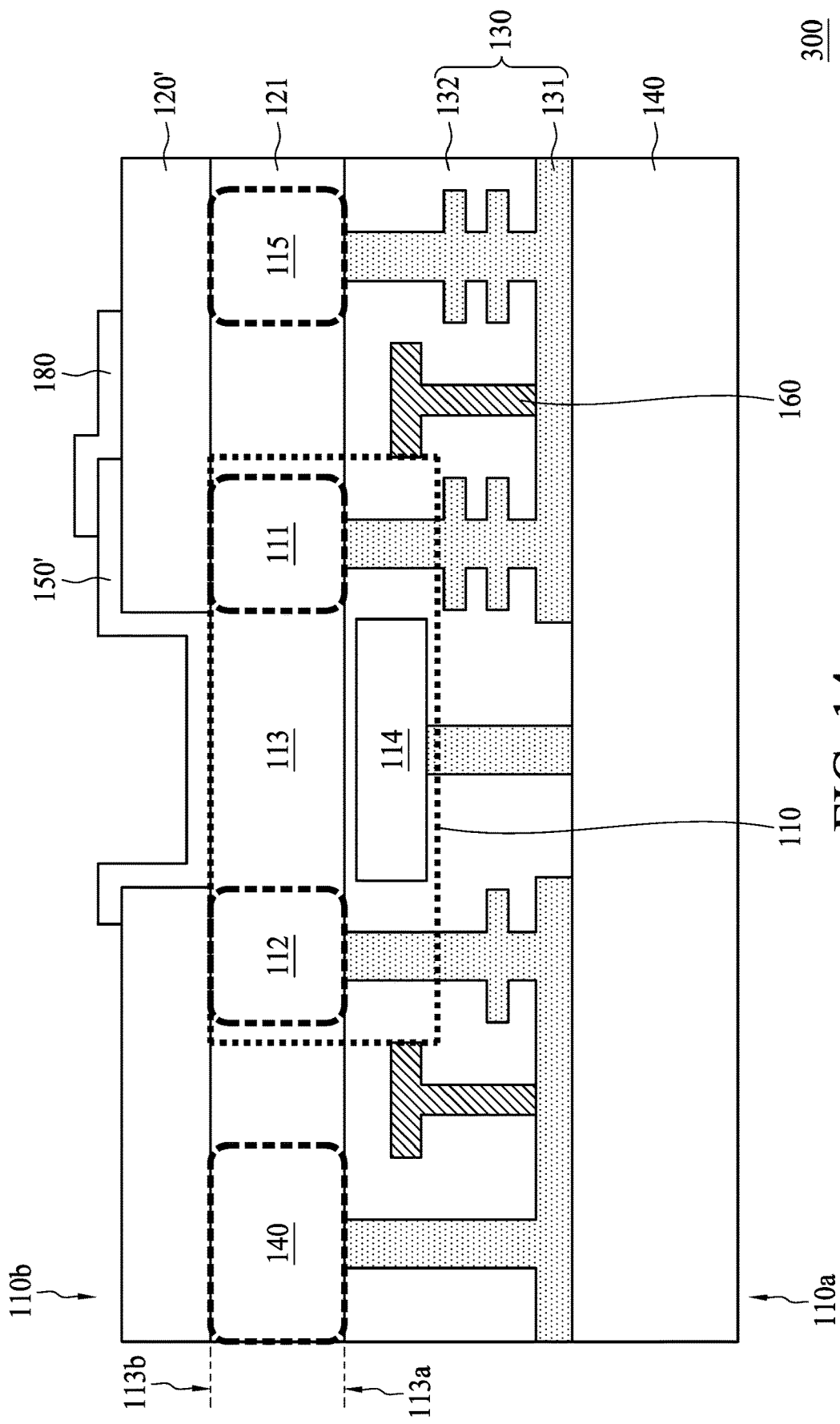
FIG. 14 is a cross-sectional diagram of a semiconductor structure in one of numerous operations in accordance with some embodiments of the present disclosure.

Referring to FIG. 14, in addition to the features included in the semiconductor structure 200 as shown in FIG. 13, an electrical contact 180 is formed over the second side 110b of the transistor 110 to electrically connect to the linear layer 150'. In some embodiments, the electrical contact 180 is made of suitable metal materials, e.g., tungsten, copper, nickel or alloys thereof. In some embodiment, the electrical contact 180 is separated from the doping region 121 by the BOX layer 120'. In some embodiments, a deposition operation and a patterning operation are performed to form the electrical contact 180. In some embodiments, the deposition operation of the electrical contact 180 is a conformal deposition operation. The semiconductor structure 300 is formed. In some embodiments, an interconnect structure, similar to the interconnect structure 130, is formed over the second side 110b of the transistor 110 on the BOX layer 120' to electrically connect to the electrical contact 180 while the linear layer 150' remains exposed to the environment.

Therefore, some embodiments of the present disclosure provide a method for manufacturing a semiconductor structure, and the method includes the following operations. A substrate having a transistor is received, wherein the transistor includes a channel region and a gate on a first side of the channel region. The second side of the channel region of the transistor is exposed, wherein the second side is opposite to the first side. A metal oxide is formed on the second side of the channel region of the transistor, wherein the metal oxide contacts the channel region and is exposed to the environment.

Some embodiments of the present disclosure provide a semiconductor structure, which includes a transistor and a resistor. The transistor includes a source, a drain, a channel region between the source and the drain, and a gate on a first side of the channel region. The resistor is disposed on a second side of the channel region, wherein the second side is opposite to the first side, and the resistor is exposed to react with a target gas in the environment to change an electrical resistance of the transistor.

Some embodiments of the present disclosure provide an operation of a semiconductor device. The operation includes the following sub-operations. The semiconductor device is received, wherein the semiconductor device includes a metal oxide exposed to the environment, wherein the metal oxide contacts a channel region of a transistor. Electrical charges are transferred between the metal oxide and a target gas in the environment to which the metal oxide is exposed. A first voltage is provided to a gate of the transistor, e.g. after each elapsing of a default time interval. It is determined whether a first current generated in the transistor by the first voltage exceeds a predetermined range. Finally, the electrical charges of the metal oxide are restored.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a source and a drain of a transistor;
a channel region of the transistor, between the source and the drain;
a gate of the transistor, on a first side of the channel region;
a resistor, on a second side of the channel region, wherein the second side is opposite to the first side, and the resistor is exposed to react with a target gas in the environment to change an electrical resistance of the transistor.

2. The semiconductor structure of claim 1, further comprising:
a buried oxide layer, on the second side of the channel region, the buried oxide layer having a through hole exposing the channel region of the transistor.

3. The semiconductor structure of claim 2, wherein the resistor is conformal to the through hole and a portion of the channel region is exposed through the through hole.

4. The semiconductor structure of claim 1, wherein the resistor contacts the channel region of the transistor.

5. The semiconductor structure of claim 1, further comprising:
a heater, disposed on the first side of the channel region of the transistor, to facilitate an oxidation or a reduction of the resistor.

6. The semiconductor structure of claim 1, further comprising:
a circuit, electrically coupled to the transistor to aid in the operation of the transistor.

7. The semiconductor structure of claim 1, further comprising:
a first contact, electrically connected to the gate to provide a first voltage to the gate; and
a second contact, electrically connected to the resistor to provide a second voltage to the resistor.

8. The semiconductor structure of claim 1, wherein the resistor includes at least one of zinc oxide, tin oxide, indium oxide, zirconium oxide, cerium oxide, and nickel oxide.

9. A semiconductor structure, comprising:
a substrate;
a transistor, including a source in the substrate, a drain in the substrate, a channel region between the source and the drain, and a gate on a first side of the substrate;

a resistor, on a second side of the substrate opposite to the first side; and a contact, covering a first portion of the resistor from the second side of the substrate, wherein a second portion of the resistor is exposed to react with a target gas in the environment to change an electrical resistance of the transistor.

10. The semiconductor structure of claim 9, further comprising:

an interconnect structure, covering the gate of the transistor from the first side of the substrate and electrically connecting to the gate of the transistor.

11. The semiconductor structure of claim 9, further comprising:

an external device, disposed on the first side of the substrate and electrically connecting the transistor.

12. The semiconductor structure of claim 11, wherein the external device includes at least one of a temperature control loop, a temperature sensor, a signal detector, and an alarm.

13. The semiconductor structure of claim 9, wherein the source and the drain of the transistor is electrically connected to the interconnect structure.

14. The semiconductor structure of claim 9, further comprising:

a metal pattern, disposed in the interconnect structure proximal to the resistor to provide thermal energy to the resistor.

* * * * *